United States Patent [19]

Supan et al.

[11] Patent Number: 5,045,972

[45] Date of Patent: Sep. 3, 1991

[54] HIGH THERMAL CONDUCTIVITY METAL MATRIX COMPOSITE

[75] Inventors: Edward C. Supan, Chatsworth; Joseph F. Dolowy, Jr., West Hills, both of Calif.; Bradley A. Webb, Las Vegas, Nev.

[73] Assignee: The Standard Oil Company, Cleveland, Ohio

[21] Appl. No.: 573,609

[22] Filed: Aug. 27, 1990

[51] Int. Cl.$^5$ .............................................. H02B 1/00
[52] U.S. Cl. .................................... 361/387; 75/245; 75/247; 75/249; 75/243; 419/23; 419/48; 419/11; 428/408; 428/539.5; 428/552
[58] Field of Search ............... 75/245, 247, 249, 243; 419/23, 48, 11; 428/408, 539.5, 552; 361/387

[56] References Cited

U.S. PATENT DOCUMENTS

| | | | |
|---|---|---|---|
| 3,306,720 | 2/1967 | Darrow | 75/231 |
| 3,650,715 | 3/1972 | Brushek et al. | 75/231 |
| 3,912,500 | 10/1975 | Vereschagin et al. | 75/201 |
| 4,333,986 | 6/1982 | Tsuji et al. | 423/446 |
| 4,412,980 | 11/1983 | Tsuji et al. | 423/446 |
| 4,425,315 | 1/1984 | Tsuji et al. | 423/446 |
| 4,439,237 | 3/1984 | Kuminitsu et al. | 75/243 |
| 4,505,746 | 3/1985 | Nakai et al. | 75/243 |
| 4,518,659 | 5/1985 | Gigl et al. | 428/539.5 X |
| 4,636,253 | 1/1987 | Nakai et al. | 75/243 X |
| 4,664,705 | 5/1987 | Horton et al. | 75/243 |

*Primary Examiner*—Brooks H. Hunt
*Assistant Examiner*—Leon Nigohosian, Jr.
*Attorney, Agent, or Firm*—Michael F. Esposito; David P. Yusko; Charles S. Lynch

[57] ABSTRACT

A thermally conductive diamond metal composite consisting essentially of 5 to 80 volume percent diamond particles having a particle size ranging from about 1 to 50 μm and a metal matrix comprising a thermally conductive metal. Preferably, a fine metal powder having particle size below 53 microns is utilized as the source for the metal matrix.

8 Claims, No Drawings

HIGH THERMAL CONDUCTIVITY METAL MATRIX COMPOSITE

BACKGROUND OF THE INVENTION

This invention relates to high thermal conductivity composite material systems comprising a metal matrix and diamond particles. In particular, the present invention is directed to high thermally conductive composite materials useful as electronic heat sinks wherein the diamond particulate reinforcement material for the metal matrix has a particle size of between 1 to 50 μm.

The composite of the present invention may be used for thermal buses and heat sinks for electronic devices wherein the primary design objective is the removal of the heat by solid state means. Other applications lie in the thermal management of any type heat source combined with low coefficient of thermal expansion (CTE)/high thermal-transfer mounting, handling and packaging applications of electronic devices, especially as provided for high power semiconductors and other advanced electronic devices.

European Patent Application No. 0,284,150 discloses a method of making a diamond heat sink which comprises metallizing at least one surface of a diamond and attaching the metallized diamond to a base layer. Diamond composite materials are also known for use as abrasives. The diamond particles used in forming the metal composites used for abrasives have a particles size which are too large and unsuitable for purposes of the present invention. For examples of diamond composite abrasive materials, see U.S. Pat. Nos. 3,912,500; 4,362,535; 4,373,934 and 4,439,237.

SUMMARY OF THE INVENTION

It is the primary object of the present invention to provide a composite material having high thermal conductivity.

It is another object of the present invention to provide a high thermally conductive composite material which can be used as a heat sink to transfer heat away from an electronic device.

Additional objects, advantages and novel teaches of the invention will be set forth in part in the description which follows, and in part will become apparent to those skilled in the art upon examination of the following or may be learned by practice of the invention. The objects and advantages of the invention may be realized and obtained by the means of instrumentalities in combinations particularly pointed out in the appended claims.

To achieve the foregoing under the objects and in accordance with the purpose of the present invention as embodied and broadly described herein, the high thermal conductivity composite material of the present invention comprises a metal matrix composite containing diamond particles wherein the diamond particles constitute reinforcement for the metal matrix and have a particle size ranging from about 1 to 50 μm.

In another aspect of the present invention a process is disclosed for improving the thermal conductivity of an electrical device comprising attaching onto at least one surface of the electronic device a thermally conductive base layer comprising a reinforced composite material comprising a metal matrix and diamond particles having a particle size ranging from between about 1 to 50 μm.

In a further aspect of the present invention the process of fabrication of the thermally conductive composite of the present invention comprises mixing 5 to about 80 volume percent diamond particles having a size ranging between about 1 to 50 μm with a metal matrix powder to form a powder blend and heating the powder blend to an elevated temperature under pressure to consolidate the powder into a composite.

In the practice of the present invention it is preferred that the metal particles forming the matrix be in the form of extremely fine metal powders. For example, −270 mesh powder (i.e. 53 microns or less) most preferrably −325 mesh powder (i.e. 44 microns or less) are suitable in the practice of the present invention.

In a preferred embodiment of this aspect of the present invention the process further comprises heating the powder blend under pressure to a temperature sufficient to melt the metal powder to enable the metal to flow into the voids between the diamond particles and then decreasing the temperature to solidify the metal matrix about the diamond particles.

The present composite material represents a distinct improvement over other thermally conductive composites because diamonds have the highest thermal conductivity of any known substance. Type II A monocrystalline diamonds possess a thermal conductivity 5 times higher than copper at room temperature and 25 times higher than copper at liquid air temperature. The inclusion of the diamond particulate in the metal matrix allows for a superior and more efficient transfer of heat away from the surface of the electronic device through the highly conductive diamond matrix.

DETAILED DESCRIPTION OF THE INVENTION

The high thermal conductivity composite material of the present invention comprises a metal matrix and diamond particulate wherein the diamond particles have a particle size of between about 1 to 50 μm.

The matrix selected for the composite is not particularly critical. However, aluminum, copper, magnesium, silver and their alloys because of their high thermal conductivities are preferred.

The diamond particles may be either natural or synthetic. Type IIA diamonds are preferred because they have the highest thermal conductivity of any known substance. The particle size of the diamonds used in the composite will be a function of the exact application of the composite. The particle size can range from 1 to 50 μm, preferrably from 1 to about 40 μm, especially preferred being between 10 to 30 μm. Usually, the particle size can decrease to the lower end of the range (1 to 10 μm) for very low volume fractions (i.e. 5 to 10%) of diamond in the composite material. However, for high performance of the composite as a heat sink or thermal bus the volume fraction of the diamond should be as high as practical in the order of 40 to 60 volume percent. In those instances, the particle size of the diamonds should be in the higher end of the range, for example 20 to 40 μm. The particle size of the diamond particulate is believed to be critical and large particulate diamonds greater than 50 μm commonly used in abrasive wheels, saw blades and other cutting tools are not deemed suitable in the practice of the present invention.

The diamond particles should be present in the metal matrix in an amount sufficient to reinforce the matrix. Typically, the diamond particles are present in the range of 5 to 80 volume percent, preferably 10 to 60 volume percent, especially preferred being 20 to 50 volume percent.

The composite materials of the present invention may be made by conventional methods. Primarily, typical fabrication processes use powder metallurgy techniques which include consolidation of the composite powder blend by vacuum hot pressing, casting and explosive consolidation. Other fabrication processes include compaction of diamond powder and infiltrating the voids of the resulting compact with molten metal under pressure, as described in U.S. Pat. No. 3,912,500 herein incorporated by reference.

The examples set forth below are intended to further describe the instant invention and are for illustrative purposes only.

EXAMPLE 1

Type IB monocrystalline synthetic diamonds (electronic grade) having a particle size of 20 μm were mixed with −325 mesh 6061 Al powder in proportions of 40 v/o diamonds and 60 v/o 6061 Al. The powder blend was vacuum hot pressed at 1105° F. for 30 minutes under 4.5 ksi pressure. The fully consolidated part was 5.0 inches in diameter ×0.235 inch thick. Thermal conductivity of test specimens by the thermal diffusivity method gave the following results:

| Test Temperature, °C. | Thermal Conductivity, W/mK |
|---|---|
| 75 | 226 |
| 125 | 234 |

The linear coefficient of thermal expansion (CTE) in the temperature range of −30° C. to 50° C. was determined by automatic recording dilatometry to be 3.8 ppm/°F. In the temperature range −150° C. to 150° C. the CTE was 5.0 ppm/°F. For purposes of reference, the thermal conductivity and CTE of 6061-0 Al at 20° C. (68° F.) are 180 W/mk and 13.1 ppm/°F., respectively.

EXAMPLE 2

A composite was made with 40 v/o Type IB monocrystalline synthetic diamonds (20 μm particles) in a matrix of Al-13 Si alloy by the following procedure. The powder blend was vacuum hot pressed by heating to 1040° F. under a pressure of 4.5 ksi for 15 minutes. Heating was then continued to 1120° F. while allowing the pressure to gradually decrease to atmospheric pressure. The temperature was held at 1120° F. for 15 minutes. At that temperature the metal matrix is in a molten state. The temperature is then decreased to 1040° F. (metal matrix is no longer in molten state) and the pressure was then increased to 4.5 ksi. The composite was subjected to these conditions for 15 minutes and then cooled. The fully consolidated part was 5.0 inches diameter ×0.248 inch thick. Thermal conductivity, measured by the Kohlrausch method, gave the following results:

| Test Temperature, °C. | Thermal Conductivity, W/mK |
|---|---|
| 31 | 235 |
| 75 | 236 |
| 125 | 240 |

Young's modulus was determined by tension tests of two specimens which gave values of 28.2 and 28.5 msi. For purposes of reference, Young's modulus of aluminum alloys are typically about 10 msi. CTE over the temperature range of −150° C. to 150° C. was 3.9 ppm/°F. CTE in the range of −60° C. to 130° C. was 4.5 ppm/°F.

The composite material of the present invention has extremely good thermal conductivity properties and may be utilized as a heat sink for electronic devices. The composite material may be applied or attached to the electronic device by any known procedure. For example, the composite material may be applied to the electronic device by the use of any suitable thermally conductive adhesive layer known in the art.

The foregoing description of the preferred embodiments of the invention have been presented for purpose of illustration and description. It is not intended to be exhausted or to limit the invention to the precise form disclosed, and obviously many modifications and variations are possible in light of the above disclosure. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What we claim is:

1. An electronic device having on at least one surface thereof a thermally conductive composite layer as a heat sink consisting essentially of a metal matrix selected from the group consisting of aluminum, magnesium, copper, silver and alloys thereof and diamond particles having a particulate size ranging from about 1 to 50 μm.

2. The device of claim 1 wherein the composite contains between 5 to 80 volume percent diamond particles.

3. The device of claim 2 wherein the diamond particles have a size range of between 1 to 40 μm.

4. The device of claim 3 wherein the diamond particles have a size range of between 10 to 30 μm.

5. The devices of claim 4 wherein the metal matrix is Al.

6. The device of claim 4 wherein the metal matrix is Mg.

7. The device of claim 4 wherein the metal matrix is Cu.

8. The device of claim 4 wherein the metal matrix is Ag.

* * * * *